United States Patent [19]

Tsuchikane et al.

[11] 4,453,255
[45] Jun. 5, 1984

[54] CHARACTERISTIC CONTROL SYSTEM FOR A DIGITAL EQUALIZER

[75] Inventors: Yoshiyuki Tsuchikane, Tokyo; Masao Kasuga, Sagamihara, both of Japan

[73] Assignee: Victor Company of Japan, Ltd., Yokohama, Japan

[21] Appl. No.: 345,459

[22] Filed: Feb. 3, 1982

[30] Foreign Application Priority Data

Feb. 5, 1981 [JP] Japan ................................ 56-14938
Feb. 5, 1981 [JP] Japan ............................ 56-14344[U]
Feb. 27, 1981 [JP] Japan ................................ 56-27844

[51] Int. Cl.³ .............................................. H04B 3/14
[52] U.S. Cl. ........................................ 375/14; 333/18; 364/724
[58] Field of Search ...................... 375/12, 11, 13, 14; 333/18, 28 R; 364/724, 825

[56] References Cited

U.S. PATENT DOCUMENTS

| 4,321,685 | 3/1982 | Kasuga et al. | 364/724 |
| 4,334,313 | 6/1982 | Gitlin et al. | 364/724 |
| 4,351,060 | 9/1982 | Treiber | 375/12 |
| 4,352,162 | 9/1982 | Nyuji et al. | 364/724 |
| 4,361,892 | 11/1982 | Martin | 333/18 |

FOREIGN PATENT DOCUMENTS 2933004 8/1979 Fed. Rep. of Germany .

Primary Examiner—Robert L. Griffin
Assistant Examiner—Stephen Chin
Attorney, Agent, or Firm—Ladas & Parry

[57] ABSTRACT

A characteristic control system for a digital equalizer comprises a digital equalizer constructed from a digital filter, for directly giving a desired equalizing characteristic with respect to a digital pulse-modulated signal, and a control part for changing the equalizing characteristic of the digital equalizer from a first arbitrary characteristic to a second arbitrary characteristic so that one or a plurality of intermediate equalizing characteristic is obtained before reaching the desired second arbitrary characteristic.

4 Claims, 13 Drawing Figures

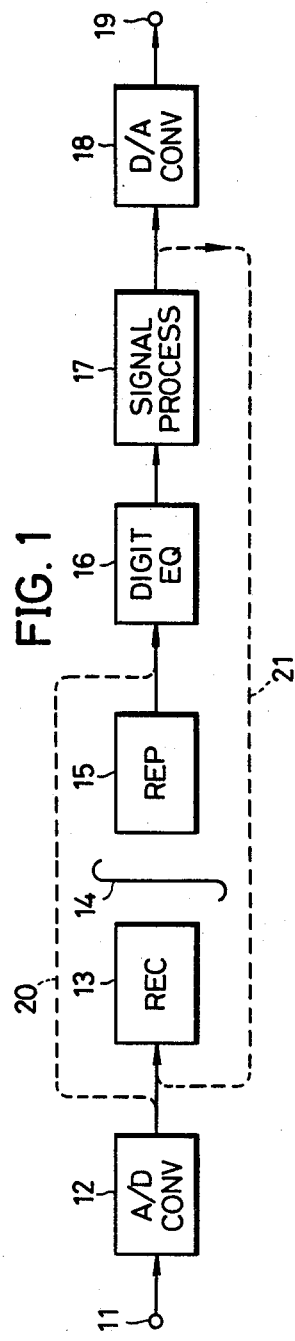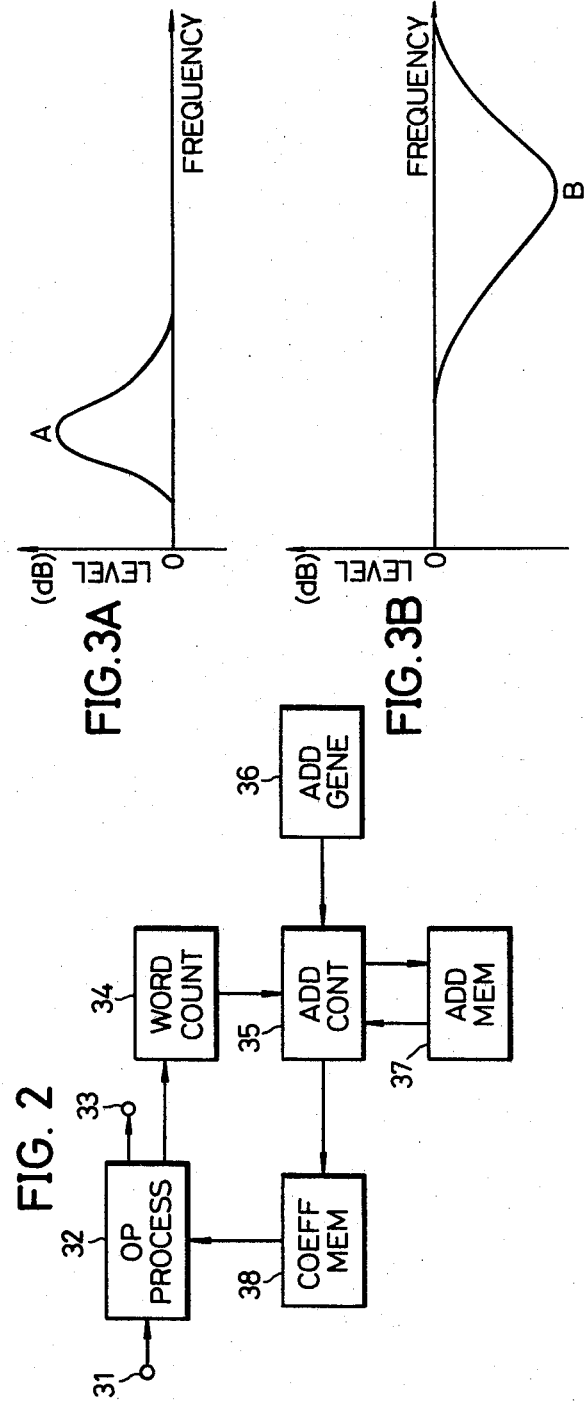

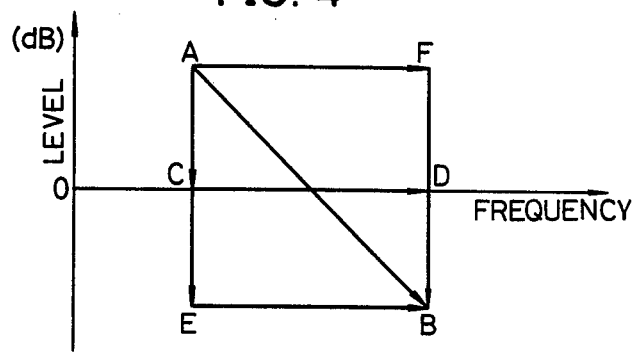
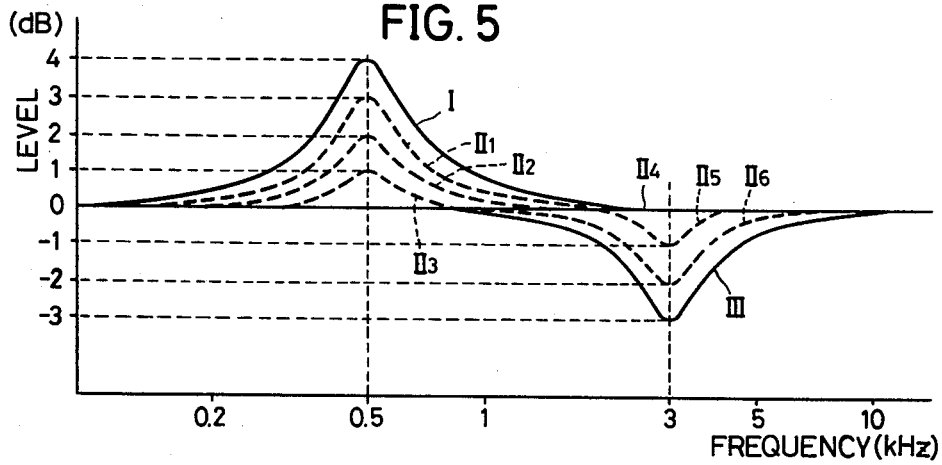
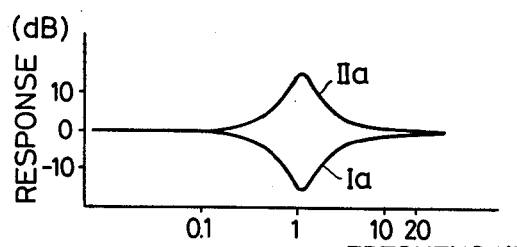
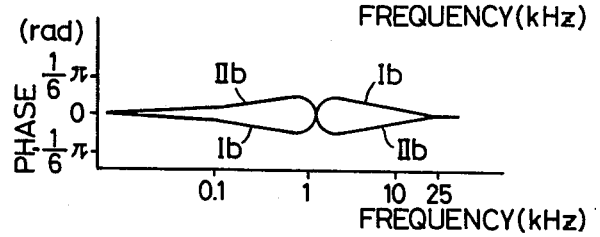

FIG. 8
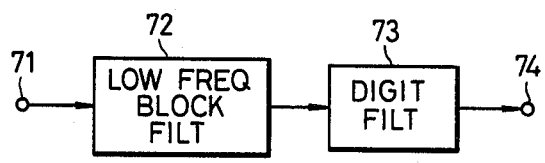
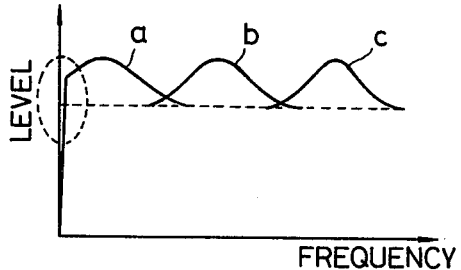
FIG.9A
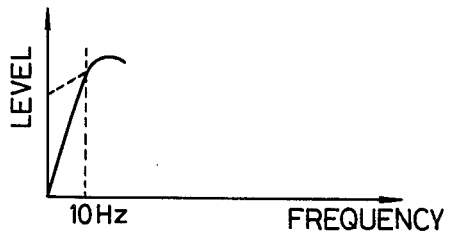
FIG.9B
FIG.10
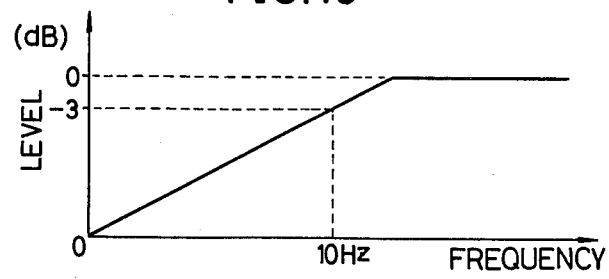

CHARACTERISTIC CONTROL SYSTEM FOR A DIGITAL EQUALIZER

BACKGROUND OF THE INVENTION

The present invention generally relates to characteristic control systems for digital equalizers, and more particularly to a control system for a digital equalizer, in which one or a plurality of intermediate characteristics are set between first and second arbitrary characteristics when an equalizing characteristic of the digital equalizer is changed from the first arbitrary characteristic to the second arbitrary characteristic, to change the characteristic by successively obtaining the intermediate characteristic at each stage, and moreover, control is performed so that the change to each characteristic is performed with every lapse of a predetermined time, in order to prevent generation of noise and the like originated from the characteristic change of the digital equalizer when obtaining an analog signal by subjecting an output of the digital equalizer to a digital-to-analog conversion, so that the practicality of the digital equalizer is improved.

Conventionally, in systems for recording and reproducing digital pulse-modulated signals (such as a pulse code modulated signal), characteristic equalization for giving a predetermined amplitude or phase frequency characteristic was performed with respect to an analog signal obtained by subjecting a reproduced digital signal to a digital-to-analog conversion at a D/A converter. As another alternative, the characteristic equalization was performed with respect to a modulated signal of the digital pulse-modulated signal, that is, the original analog signal. The reason why the above method was employed is that the characteristic equalization could not be performed directly with respect to the digital signal, and only with respect to the analog signal.

Accordingly, even in a case of a digital signal obtained by high-quality recording, a signal processing such as passing the digital signal through a D/A converter was conventionally essential. Thus, degradation was introduced in the sound quality (if the input analog signal is an audio signal) when the digital signal passes through an analog system. In addition, there was a disadvantage in that the equalizer itself, which performs the characteristic equalization with respect to the analog signal, caused degradation in the sound quality.

Therefore, in order to prevent the above degradation in the sound quality, it was highly desirable to construct a digital equalizer capable of performing equalization of the amplitude and phase frequency characteristic of the converted analog output signal obtained from the digital signal, directly with respect to the digital signal. When realizing such a digital equalizer, it would be desirable to design the digital equalizer so that the characteristic equalized by the digital equalizer can be arbitrarily changed, and no noise is generated upon changing of the equalizing characteristic.

SUMMARY OF THE INVENTION

Accordingly, it is a general object of the present invention to provide a novel and useful characteristic control system for a digital equalizer, in which the above described disadvantages have been overcome.

Another and more specific object of the present invention is to provide a characteristic control system in which control is performed so that an equalizing characteristic of a digital equalizer is changed from a first arbitrary characteristic to a second arbitrary characteristic by successively changing the characteristic to one or a plurality of intermediate characteristics between the first and second arbitrary characteristics, before reaching the desired second arbitrary characteristic. According to the system of the present invention, sudden change in the spectrum distribution of the output signal can be supressed compared to the case where the characteristic is directly and suddenly changed to the second characteristic from the second characteristic, and the generation of noise due to the characteristic change can be prevented.

Still another object of the present invention is to provide a characteristic control system for a digital equalizer in which each of the above characteristic change is performed with a time interval greater than the time required for the digital filter characteristic to stabilize. According to the system of the present invention, since the characteristic change is not performed during the period in which the digital filter is not stabilized, noise is prevented from being generated due to characteristic change during a transient response interval in which the digital filter is not stabilized. Hence, the characteristic can be changed into a desired characteristic without generating noise which badly effects the audibility, and the practicality of the digital equalizer can be greatly improved.

Other objects and further features of the present invention will be apparent from the following detailed description when read in conjunction with the accompanying drawings.

BRIEF DESCRIPTION OF THE DRAWINGS

FIG. 1 is a systematic block diagram showing an embodiment of a digital signal recording and reproducing system provided with a digital equalizer which is to be controlled by a characteristic control system according to the present invention;

FIG. 2 is a systematic block diagram showing an embodiment of a characteristic control system for a digital equalizer according to the present invention;

FIGS. 3A and 3B are graphs respectively showing equalizing characteristics before and after the characteristic is changed;

FIG. 4 is a characteristic graph for explaining each example of changing paths when the equalizing characteristic is changed according to the system of the present invention;

FIG. 5 is a characteristic graph showing concrete examples of each equalizing characteristic before, during, and after the characteristic is changed according to the system of the present invention;

FIGS. 7A and 7B are characteristic graphs respectively showing an example of an amplitude frequency characteristic and a phase frequency characteristic of the circuit shown in FIG. 6;

FIG. 8 is a systematic block diagram showing an embodiment of a digital equalizer;

FIGS. 9A and 9B are graphs respectively showing an amplitude frequency characteristic of the digital equalizer shown in FIG. 8, and showing a part of the amplitude frequency characteristic in an enlarged scale; and FIG. 10 is a graph showing an example of an amplitude frequency characteristic of a low frequency blocking filter within the digital equalizer shown in FIG. 8.

DETAILED DESCRIPTION

Figure 6:
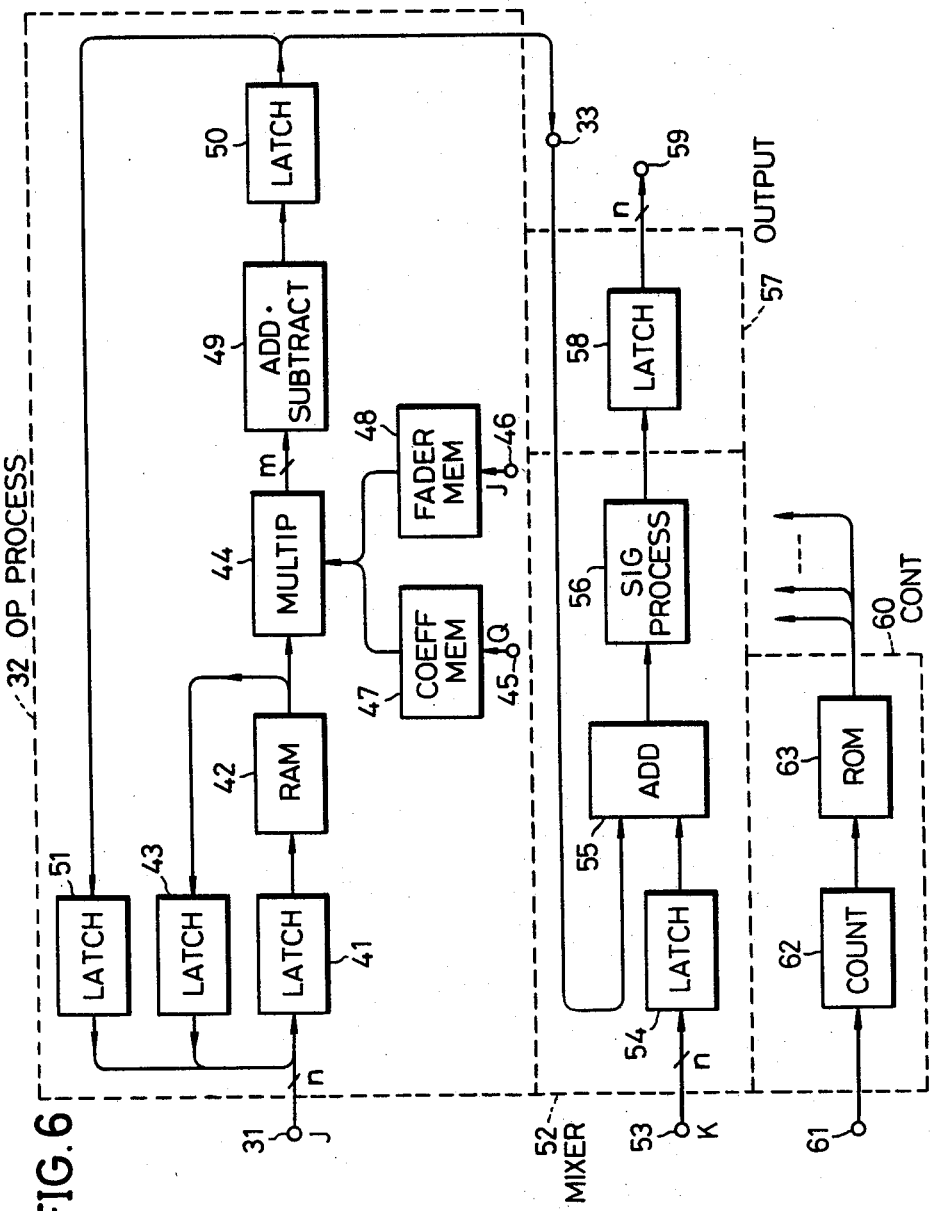
FIG. 6 is a systematic block diagram showing another embodiment of a characteristic control system for a digital equalizer according to the present invention.

In FIG. 1, an analog audio signal applied to an input terminal 11 subjected to analog-to-digital conversion at an A/D converter 12, and converted into digital pulse-modulated signal. This digital signal is recorded onto a recording medium 14 by a digital recorder 13. The recorded digital signal is reproduced from the recording medium 14 by a digital reproducing device 15. The reproduced digital signal is given a predetermined frequency characteristic (amplitude frequency characteristic and phase frequency characteristic) by a digital equalizer 16 whose characteristic is controlled by the system according to the present invention.

A digital signal obtained from the digital equalizer 16 is supplied to a signal processing circuit 17 wherein the digital signal is subjected to a signal processing such as level adjustment. The processed output digital signal is converted into an analog signal by a D/A converter 18, and obtained from an output terminal 19.

Instead of going through the above recording and reproducing process, the output digital signal of the A/D converter 12 may be supplied directly to the digital equalizer 16 as shown by a line 20. In this case, the digital signal subjected to the signal processing at the signal processing circuit 17, is recorded onto the recording medium 14 by the digital recorder 13 as shown by a line 21.

Next, description will be given with respect to an embodiment of a characteristic control system for the digital equalizer 16 which is used in the manner described above, by referring to FIG. 2. The diqital signal from the digital reproducing device 15, is supplied to an operational processing part 32 forming the digital equalizer through an input terminal 31. The operational processing part 32 is constructed from a second-order recursive digital filter described by the following difference equation, for example.

$$y_n = a_0 x_n + a_1 x_{n-1} + a_2 x_{n-2} - b_1 y_{n-1} - b_2 y_{n-2}$$

In the above equation, $a_0$, $a_1$, $a_2$, $b_1$, and $b_2$ respectively are multiplying coefficients from a coefficient memory part 38. The characteristic of the digital equalizer can be varied by varying these multiplying coefficients. Moreover, in the above equation, $x_n$, $x_{n-1}$, and $x_{n-2}$ respectively represent input digital signals at times $nT$ (where $T$ is a sampling time), $(n-1)T$, and $(n-2)T$. The terms $y_n$, $y_{n-1}$, and $y_{n-2}$ respectively represent output digital signals at the times $nT$, $(n-1)T$, and $(n-2)T$. The above multiplying coefficients are binary numbers described by a two's complement indication, for example. Moreover, the construction of the recursive digital filter described by the above difference equation will be described in the next embodiment of the invention, but the filter generally comprises a first holding circuit for holding an input digital signal, a random access memory (RAM) for storing an output of this first holding circuit, a multiplier for multiplying an output signal of the RAM with a multiplying coefficient from the coefficient memory part 38, an adder for successively adding signals from the multiplier, and a second holding circuit for holding a signal from the adder to produce an output through an output terminal and feed back this output to the above first holding circuit.

An output digital signal from the operational processing part 32 is obtained through an output terminal 33. A control signal obtained from the operational processing part 32 is applied to a word counter 34 wherein the equalizing characteristic at the operational processing part 32 is changed as described hereinafter, that is, where the time interval for changing the coefficient is controlled. Accordingly, a signal obtained from the word counter 34 with a constant time interval, is applied to an address control circuit 35. The signal thus applied to the address control circuit 35 is converted into a control signal so as to produce a multiplying coefficient stored in an address location within the coefficient memory part 38, in accordance with an address signal generated from an address generating circuit 36. Furthermore, the address specified by the control signal supplied to the coefficient memory part 38 from the address control circuit 35, is stored in an address memory circuit 37.

Next, description will be given with respect to the characteristic control of the digital equalizer having the above described construction. For example, an amplitude frequency characteristic A of one element (the number of elements is determined by the number of positions of peaks or dips formed in the amplitude frequency characteristic, for example) of the digital equalizer, shown in FIG. 3A, is changed to an amplitude frequency characteristic B shown in FIG. 3B. In this case, according to the system of the present invention, the characteristic is not changed to the characteristic B directly from the characteristic A. In the present invention, one or a plurality of intermediate characteristics are set between the characteristics A and B, and control is performed so that the characteristic successively changes to these intermediate characteristics to finally obtain the desired characteristic B.

There are various paths through which the characteristic is changed from A to B. For example, as shown in FIG. 4, the path along which the vertex of the amplitude frequency characteristic obtained moves, may be A→B, A→C→D→B, A→E→B, and A→F→B. That is, if the path A→B is chosen, for example, the changing path of the vertex of the amplitude frequency characteristic changes from the vertex A where the frequency is low and the increasing quantity of the width is large, and the frequency gradually increases. On the other hand, the increasing quantity of the width gradually decreases, simultaneously, and an attenuation characteristic is obtained at a certain frequency before finally reaching the vertex B, as shown in FIG. 4.

Regardless of which path shown in FIG. 4 is chosen, the intermediate characteristics are successively obtained before the characteristic is changed from A to B, in the present invention. Especially when the characteristics A and B differ greatly in their frequencies and levels, sudden change in the spectrum distribution of the output signal is minimized, compared to the case where the characteristic is changed directly from A to B. Accordingly, the sudden change in the analog conversion level of the output signal, or the generation of noise due to the sudden change in the DC component, is prevented according to the system of the present invention.

The word counter 34 is constructed so that each time period of the change during the successive change of characteristic through the plurality of intermediate characteristics, becomes equal to the time required for the digital filter constructing the operational processing part 32 to stabilize or a time longer than this required time. According to the experimental results obtained by the present inventors, the time required for the above digital filter to stabilize is equal to or over 10 sampling times with respect to a PCM signal sampled by a sampling frequency in the range of 45 kHz, for example. Therefore, noise is prevented from being generated due to the characteristic change during a time period when the digital filter is stabilized, because the characteristic change is not performed during the unstable period of the digital filter in the system according to the present invention.

Next, description will be given with respect to the relationship between the change in the actual numerical values of the coefficients and the change in the amplitude frequency given by the digital equalizer. It is assumed that the values (1) through (8) shown in the following table for the coefficients $a_0$, $a_1$, $a_2$, $b_1$, and $b_2$ in the difference equation of the above digital filter constructing the operational processing part 32, are stored in the coefficient memory part 38. The following table is given as an example of a case where the sampling frequency is 44.056 kHz and the Q-factor of the amplitude frequency characteristic is 0.1 and constant. Moreover, the coefficients are actually binary numbers.

TABLE

|     | $a_0$ | $a_1$ | $a_2$ | $-b_1$ | $-b_2$ |
|-----|-----------|-------------|------------|------------|-------------|
| (1) | 1.19353200 | −1.57538200 | 0.38548420 | 1.48649300 | −0.49012710 |
| (2) | 1.13460500 | −1.54534700 | 0.41437570 | 1.48649300 | −0.49012710 |
| (3) | 1.08316300 | −1.52091200 | 0.44138310 | 1.48649300 | −0.49012710 |
| (4) | 1.03883200 | −1.50192700 | 0.46673010 | 1.48649300 | −0.49012710 |
| (5) | 1.00000000 | 0.00000000 | 0.00000000 | 0.00000000 | 0.00000000 |
| (6) | 0.89683580 | −0.87188010 | 0.01243268 | 0.97083640 | −0.00822476 |
| (7) | 0.80272350 | −0.78038660 | 0.01112802 | 0.97111370 | −0.00457858 |
| (8) | 0.71747300 | −0.69750830 | 0.00994620 | 0.97246210 | −0.00237299 |

*Q = 0.1 and common

In the above case, when the amplitude frequency characteristic in which each of the coefficients have the values shown in row (1) of the table (a characteristic having a peak of 4 dB at a center frequency of 500 Hz, as indicated by a solid line I in FIG. 5) is changed to an amplitude frequency characteristic in which the coefficients have the values shown in row (8) of the table (a characteristic having a dip of −3 dB at a center frequency of 3 kHz, as indicated by a solid line III in FIG. 5), the six intermediate characteristics in which the coefficients respectively have the values shown in rows (2) through (7) of the table are successively obtained, before reaching the characteristic shown in row (8) of the table. That is, the coefficients shown in row (2) of the table is successively read out from predetermined addresses within the coefficient memory part 38, by the control signal from the address control circuit 35. Accordingly, the amplitude frequency characteristic indicated by a solid line I in FIG. 5 is changed into an amplitude frequency characteristic indicated by a dotted line $II_1$ in FIG. 5 which has a peak of 3 dB at a center frequency of 500 Hz, within one sampling time.

After 10 sampling times have lapsed from the above change in the characteristic, for example, a signal is produced from the word counter 34. Hence, the coefficients shown in row (3) of the above table are successively read out from other predetermined addresses within the coefficient memory part 38, by the operation of the address control circuit 35. Thus, the input digital signal of the operational processing part 32 is given a characteristic indicated by a dotted line $II_2$ in FIG. 5 which has a peak of 2 dB at a center frequency of 500 Hz. The characteristic is given directly with respect to the digital signal. However, when the characteristic is given, the logic value of the digital signal is changed, and the analog conversion output of this digital signal is given the characteristic indicated by the dotted line $II_2$ in FIG. 5 as a result. It will be evident from the above description that the level of the digital signal is always constant. Therefore, the characteristic of the digital equalizer is changed from that indicated by the dotted line $II_1$ to that indicated by the dotted line $II_2$ in FIG. 5.

Similarly, when the coefficients read out from the coefficient memory part 38 change from those shown in the table in an order (3)→(4)→(5)→(6)→(7) for every 10 sampling times, the amplitude characteristic given at the digital equalizer is successively changed to the intermediate characteristics indicated by dotted lines in FIG. 5, in an order $II_2 \rightarrow II_3 \rightarrow II_4 \rightarrow II_5 \rightarrow II_6$. When the coefficient $a_0$ is equal to "1.00000000" and the other coefficients $a_1$, $a_2$, $b_1$, and $b_2$ are zero as shown in row (5) of the table, the amplitude characteristic becomes as indicated by the dotted line $II_4$ which is a flat characteristic showing 0 dB throughout the entire frequency band. The characteristics indicated by the dotted lines $II_5$ and $II_6$ respectively show attenuation equalizing characteristics having dips of −1 dB and −2 dB at a center frequency of 3 kHz.

After the coefficients are changed to the coefficients shown in the row (7) of the table, the coefficients shown in the row (8) of the table is read out from the coefficient memory part 38. Accordingly, the desired amplitude frequency characteristic indicated by a solid line III in FIG. 5 which has a dip of −3 dB at a center frequency of 3 kHz, is obtained. In this concrete example, the desired characteristic was obtained through a path A→C→D→B shown in FIG. 4.

The digital filter constructing the operational processing part 32 is not limited to the above digital filter described by the above difference equation. Moreover, the phase frequency characteristic can also be changed in a similar manner.

Next, description will be given with respect to another embodiment of a characteristic control system for a digital equalizer according to the present invention, by referring to FIG. 6. The digital signal (signal accuracy of n bits for one channel, of J channels, where J is a natural number indicating the number of channels) from the digital reproducing device 16 which is applied to the terminal 31, is held at a latch 41 within the operational processing part 32. The operational processing part 32 comprising the recursive digital filter includes a multiplier 44 having an operational accuracy of m ($m \geq n$) bits, and performs an operation in accordance with the above equation. A digital signal obtained from the latch 41 is applied to a RAM 42 and stored therein. The memory data within this RAM 42 is applied to the RAM 42 after successively passing through latches 43 and 41, and stored in a new address location.

The input data $x_n$ read out from the RAM 42 is applied to the multiplier 44, and multiplied with the coefficient $a_0$ from a coefficient memory 47. An m-bit signal is thus obtained as a result of the above multiplication, and this m-bit signal is applied to an adding and subtracting circuit 49 and held therein. Next, the input data $x_{n-1}$ is read out from the RAM 42 is multiplied with the coefficient $a_1$ from the coefficient memory 47 at the multiplier 44, and then supplied to the adding and subtracting circuit 49. The rest of the calculation is accordingly performed in accordance with the remaining term $-b_2 \times y_{n-2}$. Finally, an m-bit output digital signal $y_n$ is stored into the RAM 42 by successively passing through latches 50, 51, and 41. This becomes the data for $y_{n-1}$ at the time $(n+1)T$.

The digital signal $y_n$ read out from the RAM 42 is multiplied with a coefficient ATT from a fader memory 48. A multiplied signal $z_n$ thus obtained is applied to an adder 55 within a mixer 52, through the latch 50 and the terminal 33. When the number of elements of the digital equalizer, that is, the number of frequency locations for giving amplification or attenuation amplitude frequency characteristic for equalization is P (P is a natural number), the output coefficient of the coefficient memory 47 is controlled by the control signal from the input terminal 45. Moreover, after repeating the operation to obtain the above signal $y_n$ P times, the coefficient ATT from the fader memory 48 is multiplied to obtain the output digital signal $z_n$. In addition, when the number of channels of the input digital signal applied to the input terminal 31 and the output digital signal from the output terminal 59 are J (J is a natural number), the above operation to obtain the digital signal $z_n$ is repeated J times. The output coefficient value of the memory 48 is changed by a control signal which is in accordance with the operational position of a level adjusting knob (fader), obtained from an input terminal 46.

The m-bit output digital signal $z_n$ applied to the adder 55 within the mixer 52, is added with a digital signal (signal accuracy of n bits for one channel, of K channels, where K is a natural number) obtained from an input terminal 53 through a latch 54. A signal thus obtained is supplied to a signal processing circuit 56 wherein signal processing is performed to perform a rounding operation to n bits from m bits, provide protection with respect to overflow, and the like. The n-bit digital signal for one channel thus obtained from the signal processing circuit 56 is held at a latch 58 constructing an output part 57, and produced through an output terminal 59.

On the other hand, a circuit part surrounded by a dotted line 60 is a control part. This control part generates and supplies a timing pulse for causing each block (for example, the blocks indicated by the numerals 14 to 24, and 27 to 29, and 30) to perform the above described operations, by maintaining synchronism with external digital devices when necessary. The circuit part comprises a counter 62 provided with a synchronizing input interface for counting the synchronizing input signal from an input terminal 61, and a read only memory (ROM) 63 driven by an output of the counter 62, for generating various timing pulses.

By repeating all the above operations with a period which is equal to the sampling time T of the input/output digital signal, it is possible to realize a digital equalizer capable of performing real-time processing.

For example, when the coefficients $a_0 = 0.9290643$, $a_1 = -1.9484430$, $a_2 = 0.9704944$, $b_1 = -1.8150360$, and $b_2 = 0.8355227$ in the above equation, the amplitude frequency characteristic indicated by a curve $I_a$ in FIG. 7A and the phase frequency characteristic indicated by a curve $I_b$ in FIG. 7B are given to the digital signal. On the other hand, when the coefficients $a_0 = 1.0763520$, $a_1 = -1.8150360$, $a_2 = 0.8355227$, $b_1 = -1.9484430$, and $b_2 = 0.9704944$ in the above equation, the amplitude frequency characteristic indicated by a curve $II_a$ in FIG. 7A and the phase frequency characteristic indicated by a curve $II_b$ in FIG. 7B are given to the digital signal. FIGS. 7A and 7B respectively show characteristics for the case where the sampling frequency is 50.35 kHz.

In the conventional digital equalizer, the DC component changes at the low frequency range in the amplitude frequency characteristic. Hence, there was a disadvantage in that the dynamic range of the signal is reduced and a kind of noise is generated due to the above change in the DC component. Thus, an embodiment of a digital equalizer which has overcome this disadvantage is shown in FIG. 8.

A digital signal applied to an input terminal 71 is supplied to a digital filter 73 through a low frequency blocking filter 72. This signal is given a desired frequency characteristic, and obtained through an output terminal 74. The low frequency blocking filter 72 comprises a digital filter, and blocks the low frequency component including the DC component.

The input digital filter is given an amplitude frequency characteristic indicated in FIG. 9A, at the digital equalizer. In FIG. 9A, curves a, b, and c respectively indicate amplitude frequency characteristics at low, intermediate, and high frequency ranges. A part encircled by a dotted line of the characteristic in the low frequency range in FIG. 9A, is shown in an enlarged scale in FIG. 9B. As clearly seen from FIG. 9B, a frequency component under 10 Hz, for example, is greatly attenuated, and the DC component is always maintained to a constant value. Accordingly, it becomes possible to prevent reduction of the dynamic range and generation of noise due to the change in the DC component.

Next, description will be given for a case where an infinite impulse response (IIR) digital filter is used for the above low frequency blocking filter 72. In this case, it is assumed that the IIR digital filter is described by the following difference equation.

$$y_n = a_0 x_n + a_0 \cdot a_1 \cdot x_{n-1} - b_1 y_{n-1}$$

For example, the coefficients have the values, $a_0 = 0.999422$, $a_1 = -0.999999$, and $b_1 = -0.9987441$. In this example, the amplitude frequency characteristic of the IIR digital filter becomes as indicated in FIG. 10 which indicates a low frequency blocking characteristic having a cutoff frequency of 10 Hz. Accordingly, the attenuation at the DC component becomes $-\infty$ in this case. Moreover, it is not essential for the cutoff frequency of the low frequency blocking characteristic to be 10 Hz. All that is required is for the characteristic to have a cutoff frequency which does not interfere with the desired band, so that the DC component is blocked.

In the above embodiment of the invention, the low frequency blocking filter 72 is provided at the input stage of the digital filter 73. However, the digital filter 73 may be constructed so that the digital filter 73 itself has the low frequency blocking characteristic indicated in FIG. 10.

Further, the present invention is not limited to these embodiments, but various variations and modifications may be made without departing from the scope of the present invention.

What is claimed is:

1. A characteristic control system for a digital equalizer comprising:
   a digital equalizer constructed from a digital filter, for directly giving a desired equalizing characteristic with respect to a digital pulse-modulated signal; and
   a control part for changing the equalizing characteristic of said digital equalizer from a first arbitrary characteristic to a second arbitrary characteristic so that one or a plurality of intermediate equalizing characteristics are successively obtained before the desired second arbitrary characteristic is reached, said digital equalizer comprising:
   a first holding circuit supplied with said digital signal, for holding said digital signal;
   a memory for storing an output signal of said first holding circuit, and reading out this signal thus stored;
   a second holding circuit for holding the signal read out from said memory, to feed this signal back to an input of said memory;
   a coefficient memory for storing coefficients which are in accordance with predetermined equalizing characteristics;
   a multiplier for multiplying signals respectively read out from said memory and said coefficient memory;
   an adding and subtracting circuit for successively adding and subtracting output signals from said multiplier;
   a third holding circuit for holding an output signal of said adding and subtracting circuit;
   a fourth holding circuit for holding an output signal of said third holding circuit, to feed this signal back to the input of said memory through said first holding circuit;
   an output part for obtaining an output digital signal of a predetermined number of bits from said third holding circuit; and
   a timing part for generating and applying a predetermined timing pulse to said first through fourth holding circuits, said memory, said coefficient memory, said multiplier, said adding and subtracting circuit, and the like,
   said output part producing a digital signal obtained by subjecting the input digital signal of said first holding circuit to direct characteristic equalization.

2. A characteristic control system for a digital equalizer comprising:
   a digital equalizer constructed from a recursive digital filter which is described by a difference equation including a group of multiplying coefficients, for directly giving a desired equalizing characteristic to a digital pulse-modulated signal; and
   a control part for changing the equalizing characteristic of said digital equalizer from a first arbitrary equalizing characteristic to a second arbitrary equalizing characteristic, by successively changing the group of multiplying coefficients in said difference equation from a first group of multiplying coefficients to a second group of multiplying coefficients via one or a plurality of intermediate groups of multiplying coefficients so that one or a plurality of intermediate equalizing characteristics are obtained before said second arbitrary equalizing characteristic is reached, a period with which the equalizing characteristic of said digital equalizer is changed from one equalizing characteristic to another equalizing characteristic being longer than a time required for the characteristic of the recursive digital filter to stabilize,
   said control part comprising a coefficient memory part which is pre-stored with said first, intermediate, and second groups of multiplying coefficients.

3. A characteristc control system as claimed in claim 2 in which said control part further comprises an address signal generating circuit for generating an address signal which specifies a predetermined group of addresses in said coefficient memory part where said first group of multiplying coefficients are stored, a counter for counting a sampling time of said recursive digital filter and for producing a first control signal when a predetermined count is reached, said first control signal being produced with said period with which the equalizing characteristic of said digital equalizer is changed, an address control circuit supplied with the address signal from said address signal generating circuit and the first control signal from said counter, for producing a second control signal which specifies a specific group of addresses in said coefficient memory part, an address memory part for successively storing the second control signal generated by said address control part, said address control circuit producing the same second control signal until said first control signal is received from said counter, and producing a different second control signal which specifies a different group of addresses in said coefficient memory part upon receipt of said first control signal by using the second control signal previously stored in said address memory part, said first, intermediate, and second groups of multiplying coefficients being successively read out from said coefficient memory part under the control of said second control signal and being supplied to said recursive digital filter.

4. A digital equalizer comprising:
   a first holding circuit supplied with a digital signal, for holding said digital signal;
   a memory for storing an output signal of said first holding circuit, and reading out this signal thus stored;
   a second holding circuit for holding the signal read out from said memory, to feed this signal back to an input of said memory;
   a coefficient memory for storing coefficients of a difference equation which are used to obtain predetermined equalizing characteristics;
   a multiplier for multiplying signals respectively read out from said memory and said coefficient memory;
   an adding and subtracting circuit for successively adding and subtracting output signals from said multiplier;
   a third holding circuit for holding an output signal of said adding and subtracting circuit;
   a fourth holding circuit for holding an output signal of said third holding circuit, to feed this signal back to the input of said memory through said first holding circuit;

an output part for obtaining an output digital signal of a predetermined number of bits from said third holding circuit; and a timing part for generating and applying a predetermined timing pulse to said first through fourth holding circuits, said memory, said coefficient memory, said multiplier, said adding an subtracting circuit, and the like, said output part producing a digital signal obtained by subjecting the input digital signal of said first holding circuit to direct characteristic equalization.

* * * * *